United States Patent
Ferguson et al.

[11] Patent Number: 6,160,930
[45] Date of Patent: Dec. 12, 2000

[54] OPTICAL SAMPLE AND HOLD ARCHITECTURE

[75] Inventors: Bruce A. Ferguson; Richard A. Fields, both of Redondo Beach; Mark Kintis; Elizabeth T. Kunkee, both of Manhatten Beach; Lawrence J. Lembo, Torrance; Stephen R. Perkins, Redondo Beach; David L. Rollins, Hawthorne; Eric L. Upton, Redondo Beach, all of Calif.

[73] Assignee: TRW Inc., Redondo Beach, Calif.

[21] Appl. No.: 09/133,036

[22] Filed: Aug. 11, 1998

[51] Int. Cl.[7] ........................................ G02B 6/26
[52] U.S. Cl. .................. 385/24; 385/48; 385/46
[58] Field of Search ............................ 385/24, 46, 48, 385/15

[56] References Cited

U.S. PATENT DOCUMENTS

| | | | |
|---|---|---|---|
| 5,109,449 | 4/1992 | Newberg et al. | 385/46 |
| 5,367,586 | 11/1994 | Glance et al. | 385/24 |
| 5,793,907 | 8/1998 | Jalali et al. | 385/24 |
| 5,991,068 | 11/1999 | Massicott et al. | 359/337 |

*Primary Examiner*—Hung N. Ngo
*Attorney, Agent, or Firm*—Michael S. Yatsko

[57] ABSTRACT

The optical hold unit (100) of the present invention includes an optical modulator (108) that has an electrical input, an optical input, and an optical output. A 1×N optical splitter (106) is also provided that has an optical input and N optical outputs. In addition, N optical paths (112) are individually coupled to the N optical outputs and carry one of the N output signals. Each optical path has an associated propagation delay. Optical delay elements may be located in any of the N optical paths that carry the output signals. The optical delay elements serve to lengthen the propagation delay (114a–e) of the optical path (112a–e) in which the optical delay element is located. In an alternative embodiment, the optical hold unit (200) includes an optical modulator (108) that has an electrical input, an optical input, and an optical output. An optical resonator (202) is also provided and connected to the optical output of the modulator (108). The optical resonator (202) also includes a partially transmissive output (222) to which an optical path is connected. The optical resonator (202) may also include a gain medium (208) or an optical switch (210).

20 Claims, 2 Drawing Sheets

OPTICAL SAMPLE AND HOLD ARCHITECTURE

BACKGROUND OF THE INVENTION

The present invention relates to an optical signal processing device. In particular, the present invention relates to an optical hold unit that provides time delayed samples of an optical input signal on one or more optical output lines.

Optical systems are capable of manipulating and processing optical signals that, by their very nature, are extraordinarily fast. As an example, commonly available lasers exist that produce optical output pulses less than 0.5 ps ($0.5 \times 10^{-12}$ s) in duration at a repetition rate of more than 10 GHz ($10 \times 10^9$ Hz). Optical pulses typically propagate (using optical fiber, for example) at nearly the speed of light between optical processing elements.

The processing speeds achieved by optical processing elements far outstrip the processing speeds achieved by conventional electronic processing elements. However, electronic processing elements implement an incredible variety of signal manipulation and processing functions, most of which are not available as an equivalent optical processing element. One example is the ordinary microprocessor. A microprocessor may be programmed to implement almost any function, but has no analog as an optical processing element, particularly when cost and availability considerations are taken into account. In most instances, therefore, optical processing elements must interface with electronic processing elements at some point in order to take advantage of the wide variety of functions available through electronic processing. The optical signals are converted to electrical signals at the interface between the optical processing elements and the electronic processing elements.

As one of many possible examples, electronic analog to digital (A/D) converters are very common and very useful building blocks in digital processing systems. Commonly available electronic A/D converters, however, are simply not fast enough to work with the high speed signals provided by optical processing elements. Thus, a mechanism is required for "slowing down" an optical signal to a speed appropriate for an electronic A/D converter (or other processing element) before the electronic A/D converter may be used. Such a mechanism is termed an "optical hold unit".

In the past, however, no optical hold units have been available. As a result, optical processing elements were either not used in conjunction with electronic processing elements, or the optical processing elements are underutilized by carrying slower signals (in terms of pulse width and frequency, for example) on which electronic processing elements could operate.

A need has long existed in the industry for an optical hold unit that may interface with electronic processing elements.

BRIEF SUMMARY OF THE INVENTION

It is an object of the present invention to provide an optical hold unit.

It is another object of the present invention to provide an optical hold unit that includes multiple outputs, each having an independent delay.

It is another object of the present invention to provide an optical hold unit using a single output.

Yet another object of the present invention is to use an optical resonator cavity as a building block for an optical hold unit.

Still another object of the present invention is to use a 1×N optical splitter and N delayed optical outputs to implement an optical hold unit.

It is yet another object of the present invention to combine N delayed optical hold unit outputs into a single output.

One embodiment of the optical hold unit of the present invention includes an optical modulator that has an eletrical input, and optical input, and an optical output. A 1×N optical splitter is also included that has an optical input and N optical outputs. The optical input of the splitter is connected to the optical output of the modulator. Preferably, the 1×N splitter is an optical amplifier splitter. Each of the N optical outputs provides an output signal which is a copy of the input signal presented on the optical input of the 1×N splitter. In addition, N optical paths are individually coupled to the N optical outputs to receive one of the N output signals. Each optical path has an associated propagation delay created, for example, by optical delay elements located in any of the N optical paths that carry the output signals. The optical delay elements serve to lengthen the propagation delay of the optical path in which the optical delay element is located.

The optical hold unit may, for example, use optical fiber to implement the optical path. The associated optical delay elements may then be implemented by providing optical fibers of differing lengths that extend the length of an optical path. An optional optical combiner (not shown), which includes N optical inputs and 1 optical output, may be provided to produce a combined optical signal output including each of the N output signals.

In an alternative embodiment, the optical hold unit includes an optical modulator that has an electrical input, an optical input, and an optical output. An optical cavity is also provided and is connected to the optical output of the modulator. The optical cavity includes a partially reflective and partially transmissive cavity output to which an optical path is connected.

The optical cavity may also include a gain medium. In addition to amplifying the signal in the optical cavity, the gain medium may also eliminate the signal in the optical cavity under the direction of a gain control input (for example, by setting the amplification to zero). Alternatively or in addition to the gain medium, the optical cavity may include an optical switch that eliminates the signal in the optical cavity (for example, by absorbing the signal or by reflecting the signal out of the cavity) under the control of an optical switch input.

DETAILED DESCRIPTION OF THE INVENTION

Figure 1:
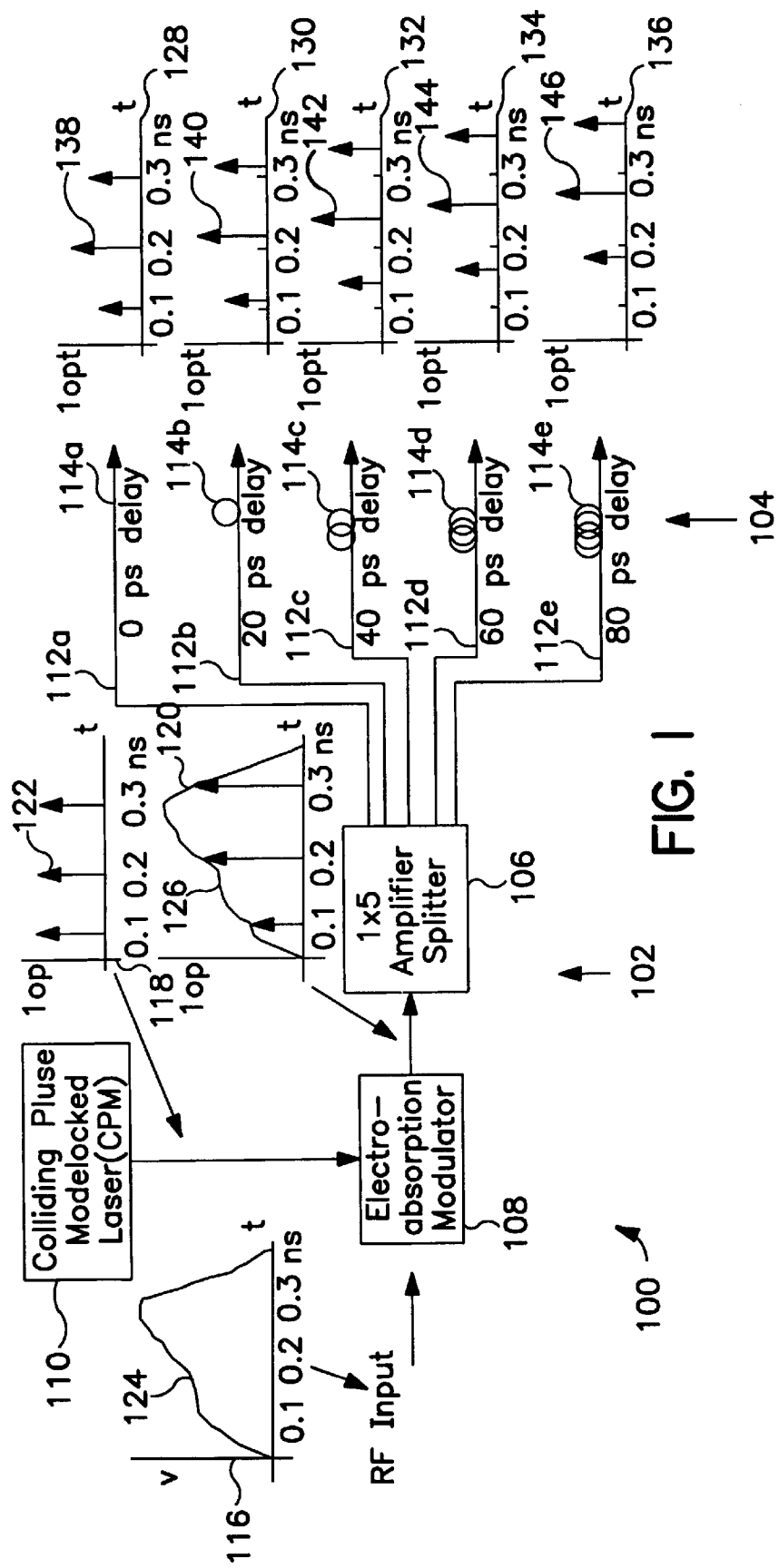
FIG. 1 illustrates one embodiment of an optical hold unit that includes a 1×N optical splitter and N optical paths with independent delay.

Turning now to FIG. 1, that figure illustrates one embodiment of an optical hold unit 100. The optical hold unit 100 generally includes an input section 102 and an output section 104. The input section 102 includes a 1×5 amplifier splitter 106, an electroabsorption modulator (EAM) 108, and a colliding pulse modelocked laser (CPM) 110. The output section 104 includes five optical paths 112a–e (collectively, "optical paths 112") and additional propagation delay delays 114a–e (collectively "delays 114") associated with the optical paths 112.

FIG. 1 also shows the numerous signals involved in the operation of the optical hold unit 100. The radio frequency (RF) input signal 116 is applied to an electrical input of the EAM 108, the pulsed signal 118 is applied to an optical input of the EAM 108, and the EAM itself produces the modulated output 120. In particular, one input pulse 122 is labeled and is shown modulated by an RF input signal value 124 to produce a modulated output pulse 126. A zero delay output signal 128, first delay output signal 130, second delay output signal 132, third delay output signal 134, and fourth delay output signal 136 are also illustrated. Delayed versions of the modulated output pulse 126 are illustrated as delayed modulated output pulses 138–146.

In operation, the RF input signal 116 and the pulsed signal 118 are applied as inputs to the EAM 108. Any signal source (for example, a satellite receiver) may generate the RF input signal 116. It is further noted that the RF input signal 116 need not consist only of RF frequency components. Rather, the RF input signal 116 may include higher frequency components or lower frequency components down to even DC.

As with the RF input signal 116, the pulsed signal 118 may be generated using a variety of signal sources. FIG. 1 illustrates a particular example in which a CPM laser 110 generates the pulsed signal 118. The CPM laser 110, may, for example, generate pulses 0.5 ps in width at a pulse rate of 10 GHz. Preferably, the pulse rate is at least twice the highest frequency component of the RF input signal 116 in order to satisfy the sampling theorem. The pulse width is preferably as short as possible to mimic an infinitely narrow impulse function.

The EAM 108 (which is commercially available for example, from TRW, Redondo Beach, Calif. 90278) modulates the pulsed signal 118 with the RF input signal 116 to produce the modulated output 120. As each individual input pulse (for example the input pulse 122) enters the EAM 108 at a particular instant in time, the EAM 108 produces an output pulse (for example, the modulated output pulse 126) that is proportional to the RF input signal 116 at that instant in time (for example, the RF input signal value 124). The modulated output 120 thereby represents samples of the RF input signal 116.

The modulated output 120 next enters the 1×5 amplifier splitter 106. The 1×5 amplifier splitter 106 is an optical splitter that provides five optical outputs each carrying an optical signal that is a copy of an input pulse provided to the 1×5 amplifier splitter 106. As shown in FIG. 1, the input pulses are provided by the modulated output 120. Each optical signal is amplified by the amplifier splitter 106 so that its power is approximately equal to the power of the input pulse.

Many variations of the amplifier splitter 106 are possible. For example, a non-amplifying splitter may be substituted in applications where the splitting losses do not hamper the ability of subsequent processing elements to work with attenuated optical outputs. In addition, if amplification is in fact needed, it need not take place inside the splitter itself. In other words, a non-amplifying splitter may be used, followed by optical amplifiers, for example, along one or more of the optical paths 112. An example of one suitable optical amplifier that may be used is a semiconductor optical amplifier.

Furthermore, the optical hold unit architecture disclosed in FIG. 1 is easily extendable to a 1×N splitter. In some applications, for instance, it may be necessary to split an input pulse into ten identical copies. A 1×10 splitter may then be substituted for the 1×5 amplifier splitter 106. In summary, the 1×5 amplified splitter 106 is only one of many types and configurations of splitters suitable for use with the optical hold unit 100.

One particularly suitable amplifier splitter that may be used with the present invention is disclosed in a co-pending application entitled "Active Multimode Optical Signal Splitter", Ser. No. 08/866,656 filed May 30, 1997 and assigned to the assignee of the present application. The above referenced co-pending application is expressly incorporated in its entirety by reference.

Still with reference to FIG. 1, the output section 104 of the optical hold unit 100 is shown including five optical paths 112 and associated optical delay elements 114. The optical paths 112 may be constructed, for example, with optical fibers, although other materials that provide a path for optical energy are also suitable (for example, semiconductor waveguides and crystalline structures).

Each of the optical paths 112 may optionally include an optical delay element. In FIG. 1, the optical paths 112b–e include optical delay elements that introduce the propagation delays into the optical paths 112b–e, respectively. In one embodiment of the present invention, the optical paths 112 are optical fibers and the optical delay elements 114b–e are additional lengths or sections of optical fiber. The additional sections of optical fiber increase the overall path length associated with the optical paths 112b–e and therefore the propagation delay associated with the optical paths 112b–e.

The optical delay elements need not, for example, be implemented as completely separate potions of optical fiber spliced together with an optical path. Rather, the optical paths 112 may be manufactured at the outset to different lengths. In such a case, the optical delay element (the additional length of fiber) is built into the optical path as manufactured.

Note that the optical path 112a has no additional section of optical fiber and therefore no additional propagation delay associated with it. In other words, the length of optical fiber associated with the optical path 112a is considered the zero delay reference, even though it, of course, has some finite propagation delay. Each of the optical paths 112b–e are extended in length beyond that of the zero delay reference optical path 112a and therefore are considered to include the propagation delays 114b–e.

The propagation delays 114b–e thus represent the extra time required for optical energy to propagate through the optical paths 112b–e over the time required for light to propagate through the optical path 112a. In FIG. 1, the optical path 112b has a propagation delay 114b of 20 ps, the optical path 112c has a propagation delay 114c of 40 ps, the optical path 112d has a propagation delay 114d of 60 ps, and the optical path 112e has a propagation delay 114e of 80 ps. The propagation delays 114b–e are not restricted to 20 ps, but may be freely chosen independently of one another to match any delay (or no delay) required.

Optical delay elements that introduce the propagation delays 114b–e may be implemented in a variety of ways (or combination of ways) other than lengthening the optical paths 112. As one example, semiconductor waveguides may be inserted into the optical paths 112. Semiconductor waveguides are particularly useful when the required propagation delays 114b–e are very small. Because the processes that build semiconductor waveguides do so very precisely, even very small delays may be implemented in a semiconductor waveguide with very exacting tolerances. As another example, the optical paths 112 may be coupled to a section of material that has a refractive index different than that of the optical paths 112. The difference in propagation speed in the material (as indicated by its index of refraction) may then create the necessary propagation delays for each optical path 112.

FIG. 1 also shows the effect of each propagation delay 114a–e on the copy of the modulated output 120 provided by the 1×5 amplifier splitter 106. The zero delay output signal 128 shows that the copy of the modulated output 120 on the optical path 112a is delayed very slightly according to the propagation delay inherent in the optical path 112a. The first delay output signal 130, second delay output signal 132, third delay output signal 134, and fourth delay output signal 136 are delayed 20 ps, 40 ps, 60 ps, and 80 ps respectively from the zero delay output signal 128.

As a result, each modulated output pulse, for example the modulated output pulse 126, repeats five times (as the delayed modulated output pulses 138–146) at 20 ps intervals across the optical paths 112. The modulated output pulse 126, in effect, has been extended from a single pulse at approximately time 0.2 ns to a "broadened" pulse existing from time 0.2 ns to 0.28 ns. In other words, the optical hold unit 100 has held the modulated output pulse 126 for 80 ps. Thus, additional processing elements (for example, electronic A to D converters) have additional time to operate on the modulated output pulse 126 by working with the held version represented by the delayed modulated output pulses 138–146.

Note that the delayed modulated output pulses 138–146 are, in reality, pulses and not continuous waveforms. However, the delay elements 114b–e and the number of outputs provided by the splitter 106 may be adjusted to make the pulses as close together over an arbitrary period of time as is necessary to prevent slower electronic processing elements from recognizing the pulse nature of the modulated output pulses. Additionally, each of the delayed modulated output pulses 138–146 may be combined into a single output using an N×1 optical combiner, for example.

In general, the single output would carry N identical modulated output pulses in series over the total delay time provided by the delay elements 114a–e. The single output would appear very much like the cavity output signal 212 in FIG. 2. The single output may be useful, for example, where an electronic processing element is unable to operate on an input waveform distributed over multiple input lines.

Figure 2:
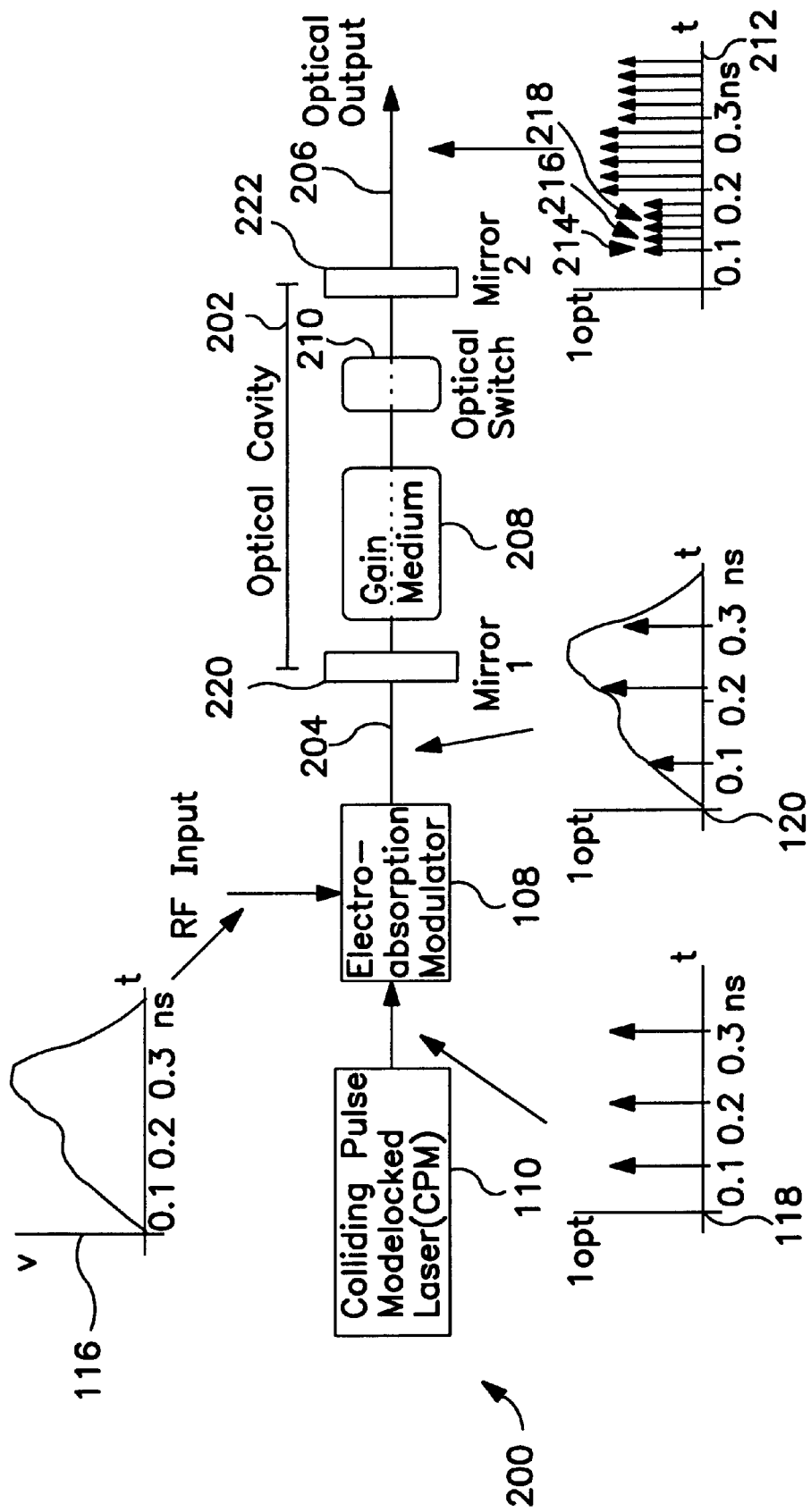
FIG. 2 shows a second embodiment of an optical hold unit that uses an optical cavity and produces a single optical output.

Turning now to FIG. 2, that figure illustrates a second embodiment of an optical hold unit 200. The electroabsorption modulator (EAM) 108 and colliding pulse modelocked laser (CPM) 110 are also shown in FIG. 2. As previously described, the RF input signal 116 is applied to an electrical input of the EAM 108, the pulsed signal 118 (generated by the CPM 110) is applied to an optical input of the EAM 108, and the EAM itself produces the modulated output 120.

An optical cavity 202 is also provided and includes a cavity input 204 and a cavity output 206 connected to an optical path (not shown). The optical cavity 202 may also include a gain medium 208, an optical switch 210, or both. An example cavity output signal 212 and three of the pulses (the first pulse 214, second pulse 216, and third pulse 218) that form the cavity output signal 212 are also shown.

One possible construction of the optical cavity 202 includes a first mirror 220 that uses a transmissive surface towards the cavity input 204 and a reflective surface facing the inside of the optical cavity 202. In addition, a second mirror 222 is provided that includes a primarily reflective and partially transmissive surface facing the inside of the optical cavity 202. A Fabry-Perot cavity is one example of such an optical cavity and is generally suitable for use in the present invention.

The Fabry-Perot cavity is generally referred to as an optical resonator. Different types of optical resonators may be substituted for the optical cavity 202, including ring laser cavities, recirculating delay lines, and distributed Bragg reflectors.

The optical cavity 202 allows optical energy to enter through the first mirror 220. The majority of the optical energy is subsequently reflected between the first mirror 220 and the second mirror 222 (and additional reflective coatings on the inside of the optical cavity 202). Each time optical energy in the cavity reaches the second mirror 222, however, a portion of the optical energy passes through the partially transmissive second mirror 222. Output pulses are thereby generated that form the cavity output signal 212.

Three output pulses 214–218 are shown in FIG. 2. The first output pulse 214 may, for instance, have been produced at the optical cavity output 206 after the first pulse of optical energy entered the optical cavity 202 and propagated partially through the second mirror 222. The delay before the first output pulse 214 is generated is therefore the propagation delay across the optical cavity 202.

Subsequently, the optical energy reflects off of the second mirror 222, propagates back to the first mirror 220, reflects off of the first mirror 220, and propagates back to the second mirror 222. The optical energy that passes through the second mirror 222 thus forms the second output pulse 216. The delay between the first output pulse 214 and second output pulse 216 is twice the propagation delay across the optical cavity 202. Similarly, the third optical pulse occurs after the second output pulse 216 and twice the propagation delay across the optical cavity 202.

After a predetermined number of output pulses have been produced (from a single input pulse) on the optical cavity output 206, the energy in the optical cavity 202 is eliminated. A different input pulse may then be introduced into the optical cavity 202 to produce another sequence of output pulses. To this end, the optical switch 210 may be opened or closed to absorb energy in the optical cavity 202, or to direct energy in the optical cavity 202 along a path out of the optical cavity 202.

For each input pulse entering the optical cavity 202, the subsequent output pulses are preferably equal in amplitude. Because the second mirror 222 only returns a portion of the energy in the optical cavity 202 to the first mirror 220, however, a gain medium is placed in the optical cavity 202 to account for the loss through the second mirror 222.

Examples of suitable gain mediums include semiconductor optical amplifiers, liquid dyes, and Erbium doped fiber amplifiers. It is further noted that the energy in the optical cavity 202 may be removed by switching off the gain medium 208 instead of, or in addition to operating the optical switch 210. For example, the pump laser associated with an Erbium fiber amplifier may be turned off for an instant to bring its gain to zero.

Thus, the output signal 212 provides, for each input pulse to the optical cavity 202, a series of output pulses. Each of the output pulses for a single input pulse is of approximately equal amplitude and appears after a predetermined delay from the previous output pulse. In effect, the single input pulse has been held for the number of output pulses, minus one, times the predetermined delay. Slower electronic processing elements, for example, may therefore operate on the held output.

While particular elements, embodiments and applications of the present invention have been shown and described, it is understood that the invention is not limited thereto since modifications may be made by those skilled in the art, particularly in light of the foregoing teaching. It is therefore contemplated by the appended claims to cover such modifications and incorporate those features which come within the spirit and scope of the invention.

What is claimed is:

1. An optical hold unit comprising:

a 1×N optical splitter comprising an optical input and N optical outputs, the N optical outputs providing N optical signals;

N optical paths, each coupled to one of said N optical outputs to carry one of said N optical signals, each of said N optical paths having as associated propagation delay; and an optical delay element located in at least one of said N optical paths carrying one of said N optical outputs, said optical delay element comprising a semiconductor waveguide lengthening said propagation delay of the optical path in which said optical delay element is located.

2. The optical hold unit of claim 1, wherein at least one of said N optical paths is an optical fiber.

3. The optical hold unit of claim 1, further comprising a N×1 optical combiner comprising N optical inputs and 1 optical output, the optical output providing a combined optical signal output.

4. The optical hold unit of claim 1, further comprising at least one optical amplifier located in at least one of said N optical paths.

5. An optical hold unit comprising:

a 1×N optical splitter comprising an optical input N optical outputs, the N optical outputs providing N optical signals;

an optical modulator connected to said optical input of said 1×N optical splitter, said optical modulator comprising an modulator optical input and a modulator electrical input;

a pulsed laser connected to said modulator optical input N optical paths, each coupled to one of said N optical outputs to carry one of said N optical signals, each of said N optical paths having as associated propagation delay; and an optical delay element located in at least one of said N optical paths carrying one of said N optical outputs, said optical delay element lengthening said propagation delay of the optical path in which said optical delay element is located.

6. The optical hold unit of claim 5, further comprising an electrical connection between said modulator electrical input and an electrical signal source.

7. The optical hold unit of claim 5, wherein said pulsed laser is a colliding pulse modelocked laser.

8. The optical hold unit of claim 5, wherein said optical modulator is an electroabsorption modulator.

9. An optical hold unit comprising:

a 1×N optical amplifier splitter comprising an optical input and N optical outputs, the N optical outputs providing N optical signals;

N optical paths, each coupled to one of said N optical outputs to carry one of said N optical signals, each of said N optical paths having as associated propagation delay; and an optical delay element located in at least one of said N optical paths carrying one of said N optical outputs, said optical delay element lengthening said propagation delay of the optical path in which said optical delay element is located.

10. A method for holding an optical input pulse, said method comprising the steps of:

generating said optical input pulse with an optical modulator;

providing a pulsed laser input to said optical modulator and providing an electrical input to said optical modulator;

splitting said input pulse into N output pulses;

coupling each of said N output pulses into an optical path, said optical path having a propagation delay; and introducing an additional delay in at least one of said optical paths.

11. The method of claim 10, further comprising the step of:

combining each of said optical paths into a single combined output.

12. An optical hold unit comprising:

an optical modulator comprising an electrical input, an optical input, and an optical output;

an optical resonator comprising a resonator input connected to said optical output, said optical output introducing an input pulse into said optical resonator, said optical resonator further comprising a resonator output that is partially transmissive; and an optical path coupled to said resonator output.

13. The optical hold unit of claim 12, further comprising a gain medium in said optical resonator.

14. The optical hold unit of claim 13, wherein said gain medium is selected from the group consisting essentially of semiconductor optical amplifiers, liquid dyes, and fiber amplifiers.

15. The optical hold unit of claim 13, further comprising an optical switch in said optical resonator.

16. The optical hold unit of claim 12, further comprising an optical switch in said optical cavity.

17. A method for holding an optical input, said method comprising the steps of:

providing an input to an optical resonator and providing an output from said optical resonator;

providing a gain medium in said optical resonator and connecting a gain control input to said gain medium;

connecting a pulsed optical signal to said input;

connecting an optical path to said output.

18. The method of claim 17, further comprising the step of controlling said gain input to cause said gain medium to absorb a pulse introduced into said optical resonator by said pulsed optical input when said optical path carries an output pulse of predetermined duration.

19. The method of claim 17, further comprising the step of placing an optical switch inside said optical cavity.

20. The method of claim 19, further comprising the step of controlling said optical switch to cause said optical switch to eliminate a pulse introduced into said optical resonator by said pulsed optical input when said optical path carries an output pulse of predetermined duration.

* * * * *